(12) United States Patent
Fukumoto et al.

(10) Patent No.: US 6,441,426 B1
(45) Date of Patent: *Aug. 27, 2002

(54) NONVOLATILE SEMICONDUCTOR MEMORY DEVICE AND METHOD OF MANUFACTURING THE SAME

(75) Inventors: Atsushi Fukumoto; Natsuo Ajika, both of Hyogo (JP)

(73) Assignee: Mitsubishi Denki Kabushiki Kaisha, Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/333,687

(22) Filed: Jun. 16, 1999

(30) Foreign Application Priority Data

Jan. 7, 1999 (JP) .............................. 11-001806

(51) Int. Cl.⁷ .............................. H01L 29/788
(52) U.S. Cl. ........................ 257/315; 257/900
(58) Field of Search ................................. 257/315, 900

(56) References Cited

U.S. PATENT DOCUMENTS

| | | | | |
|---|---|---|---|---|
| 4,807,013 A | * | 2/1989 | Manocha | 257/900 |
| 5,740,105 A | * | 4/1998 | Gill | 257/315 |
| 5,973,355 A | * | 10/1999 | Shirai et al. | 257/900 |
| 6,153,469 A | * | 11/2000 | Yun et al. | 257/316 |

FOREIGN PATENT DOCUMENTS

JP         10-12750         1/1998

* cited by examiner

*Primary Examiner*—Mark V. Prenty
(74) *Attorney, Agent, or Firm*—McDermott, Will & Emery

(57) ABSTRACT

In a semiconductor substrate surface, first and second trenches extending in parallel with each other in a bit line direction are provided. An insulation film for trench isolation is filled in the first and second trenches. A floating gate is provided between the first and second trenches on the semiconductor substrate. A sidewall spacer is provided on a sidewall surface, extending in the bit line direction, of the floating gate.

6 Claims, 16 Drawing Sheets

FIG.8 PRIOR ART
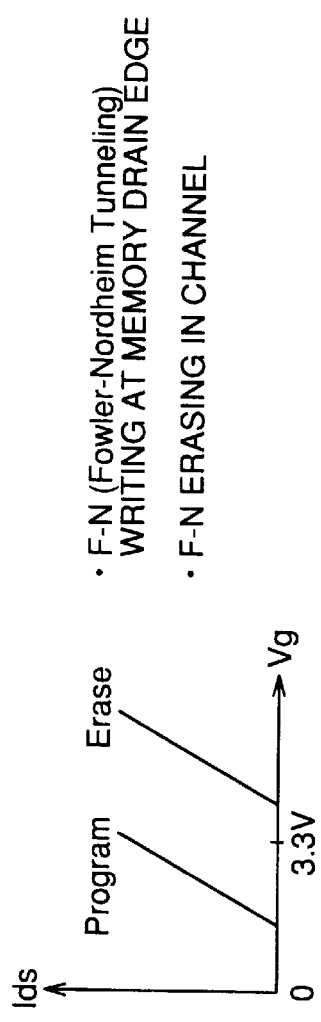
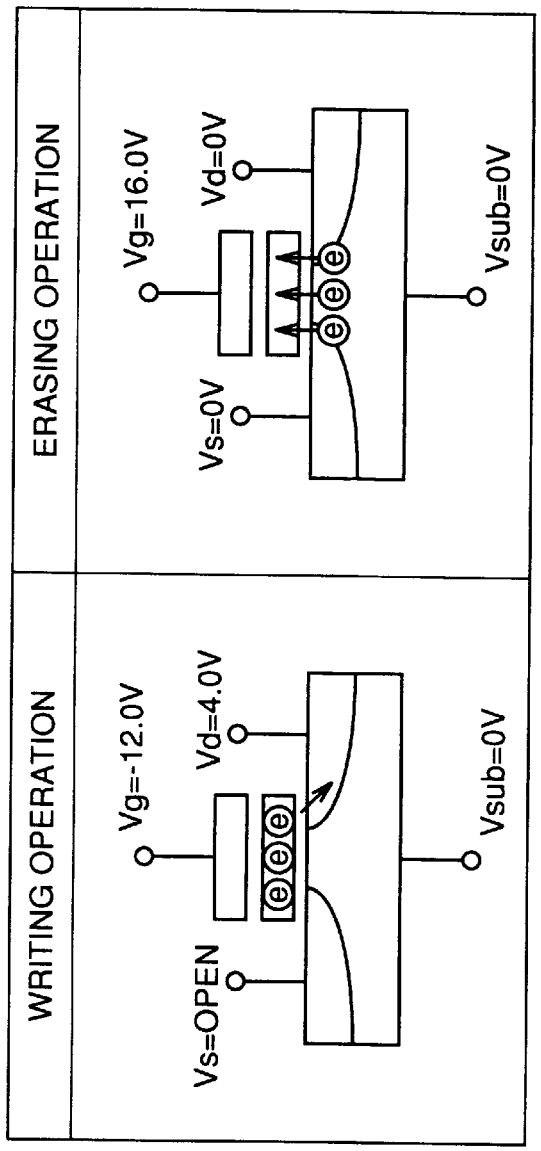

US 6,441,426 B1

NONVOLATILE SEMICONDUCTOR MEMORY DEVICE AND METHOD OF MANUFACTURING THE SAME

BACKGROUND OF THE INVENTION

1. Field of the Invention

The present invention generally relates to nonvolatile semiconductor memory devices and more particularly to a nonvolatile semiconductor memory device using trench isolation. The present invention also relates to a method of manufacturing such a nonvolatile semiconductor memory device.

2. Description of the Background Art

FIG. 6 is a plan view of a conventional nonvolatile semiconductor memory device using trench isolation. FIG. 7 shows a cross section (A) along the line A—A of FIG. 6, and a cross section (B) along the line C—C of FIG. 6.

Referring to these figures, the conventional nonvolatile semiconductor memory device includes a semiconductor substrate 1. In a main surface of semiconductor substrate 1, a linear trench 2 for trench isolation is formed in the direction Y of bit lines. An insulation film 24 for trench isolation is filled in trench 2. Trench 2 and insulation film 24 filled therein constitute a trench isolation region. On both sides of trench 2, a floating gate 4 is provided on semiconductor substrate 1 with a tunnel oxide film 3 therebetween. On floating gate 4, a control gate 6 is provided with an inter poly-insulation film 5 therebetween.

Referring next to FIG. 8, the operation of the nonvolatile semiconductor memory device will be described.

Here, the Fowler-Nordheim tunnel current writing method at a memory drain edge and the Fowler-Nordheim tunnel current erasing method on the entire channel surface, which are common to DINOR type flash memories, will be described.

Whether information is stored or not is determined by the charged and discharged states of a floating gate. When a floating gate is injected with electrons and negatively charged, $V_{th}$ becomes higher with respect to the potential of a control gate thereon (erased state). When the floating gate is not negatively charged, however, $V_{th}$ is low (written state). By applying, to the control gate, an intermediate voltage between $V_{th}$ in the erased state and $V_{th}$ in the written state, stored contents can be read through a memory cell transistor.

Writing can be performed on a basis of a bit by selecting a sub bit line (drain interconnection) and a word line (gate interconnection). Since an erase voltage can be applied on a basis of a word line (gate interconnection), erasing can be performed on a basis of a sector.

Since a floating gate electrode is covered by a high quality insulation film, injected electrons remain in the electrode unless erased. Accordingly, stored contents are maintained even if the power supply is turned off.

A conventional method of manufacturing the nonvolatile semiconductor memory device using trench isolation will be described in the following with reference to the figures.

In the figures described hereinafter, cross sections on the left side correspond to the cross section along the line A—A of FIG. 6, and those on the right side correspond to the cross section along the line C—C.

Referring to FIG. 9, a surface of semiconductor substrate (silicon substrate) 1 is oxidized to form tunnel insulation film 3 which is approximately 100 nm in film thickness. On tunnel insulation film 3, a polysilicon film 7 or amorphous silicon film (approximately 200 nm) doped with an n type impurity such as phosphorus, and a CVD oxide film 8 (approximately 100 nm) are successively deposited.

Referring to FIG. 10, a resist pattern 9 is formed by photo lithography, which has openings in portions in which first and second trenches extending in parallel with each other in the bit line direction are to be formed. Referring to FIGS. 9 and 10, resist pattern 9 is used for patterning in the bit line direction, oxide film 8, polysilicon film 7 and tunnel oxide film 3 are etched in this order, and trench 2 which is approximately 500 nm in depth is formed in the surface of semiconductor substrate 1. Thus, trench 2 is formed in a self-alignment manner with an uncompleted floating gate 4. Then, resist pattern 9 and oxide film 8 are removed.

Referring to FIGS. 10 and 11, a CVD insulation film 24 such as tetraethoxysilane (TEOS) is filled in trench 2. CVD insulation film 24 is etched to the surface of semiconductor substrate 1 such as by chemical mechanical polishing (CMP) to form uncompleted floating gate 4 which extends in the bit line direction. Then, an ONO film (thin laminate film formed of a CVD oxide film of approximately 5 nm/a CVD nitride film of approximately 5 nm/a CVD oxide film of approximately5 nm) 5 is formed to cover floating gate 4.

Referring to FIG. 12, polysilicon 13 (approximately 50 nm) doped with an n type impurity such as phosphorus, a refractory metal silicide 14 (approximately 50 nm) such as WSi, and a CVD oxide film 15 (approximately 100 nm) such as TEOS are successively deposited. On CVD oxide film 15, a resist pattern 16 for forming a control gate is formed.

Referring to FIGS. 12 and 13, CVD oxide film 15, refractory metal silicide 14, polysilicon 13, ONO film 5, and uncompleted floating gate 4 are etched in this order to complete floating gate 4 and control gate 6.

Referring to FIG. 14, a portion other than a region to be a drain region is masked by a resist pattern 17 and subjected to ion implantation to form a drain region 18.

Referring to FIGS. 15 and 16, a portion other than a region to be a source region is masked and subjected to ion implantation to form a source region 19.

Referring to FIG. 17, a bit line 20 is formed, first and second Al interconnections 21 and 22 are formed thereon with interlayer insulation films 28 and 29 therebetween, and a glass coating 23 is formed. Thus, a memory cell transistor is completed.

Since the conventional method of manufacturing the nonvolatile semiconductor memory device is as described above, problems occur as described below.

In FIG. 18, (A) and (B) are cross sections along the lines A—A and B—B of FIG. 6 in the step of FIG. 13 (a bit line contact is omitted herein).

Referring to FIGS. 18 and 13, when the trench formed in a self-alignment manner with floating gate 4 is used for isolation, problems occur in etching control gate (memory gate) 6 and also etching uncompleted floating gate 4. That is, in the cross section along the line B—B shown in (B) of FIG. 18, oxide film 24 for trench isolation in trench 2 may be etched, causing a side surface of semiconductor substrate 1, that is, a side surface of trench 2 (a portion 50 indicated by a circle in the figure) to be exposed. As described above, exposure of the side surface of semiconductor substrate 1 prevents isolation characteristics to be maintained sufficiently.

Referring to (A) of FIG. 18, there is also a problem of electric field concentration on inter poly-insulation film 5 between floating gate 4 and control gate 6 because an upper end of floating gate 4 (portion 51 indicated by a circle in the figure) is angular and sharp.

SUMMARY OF THE INVENTION

The present invention was made to solve the problems as described above, and its object is to provide an improved nonvolatile semiconductor memory device so as to be able to maintain isolation characteristics sufficiently.

Another object of the present invention is to provide an improved nonvolatile semiconductor memory device so as not to concentrate electric fields on an inter poly-insulation film between a floating gate and a control gate.

Further object of the present invention is to provide a method of manufacturing an improved nonvolatile semiconductor memory device so as to be able to maintain isolation characteristics.

Still another object of the present invention is to provide a method of manufacturing an improved nonvolatile semiconductor memory device so as not to concentrate electric fields on an inter poly-insulation film between a floating gate and a control gate.

A nonvolatile semiconductor memory device according to a first aspect of the present invention includes a semiconductor substrate. In a surface of the semiconductor substrate, first and second trenches, which extend in parallel with each other in a bit line direction, are provided. An oxide film for trench isolation is filled in the first and second trenches. Between the first and second trenches, a floating gate is provided on the semiconductor substrate. A sidewall spacer is provided on a sidewall surface, extending in the bit line direction, of the floating gate.

According to the present invention, the sidewall spacer is provided on the sidewall surface, extending in the bit line direction, of the floating gate, and therefore an angular portion of the floating gate is rounded, preventing concentration of electric fields on an inter poly-insulation film.

According to the nonvolatile semiconductor memory device in a second aspect of the present invention, the sidewall spacer is provided on sidewall surfaces, extending in the bit line direction, on both sides of the floating gate.

According to the nonvolatile semiconductor memory device in a third aspect of the present invention, the sidewall spacer is formed of polysilicon.

According to the nonvolatile semiconductor memory device in a fourth aspect of the present invention, an n type impurity is implanted in the polysilicon.

According to the nonvolatile semiconductor memory device in a fifth aspect of the present invention, the sidewall spacer increases in thickness from top to bottom.

According to the nonvolatile semiconductor memory device in a sixth aspect of the present invention, the sidewall surface, extending in the bit line direction, of the floating gate is coplanar with a sidewall surface of the trench.

According to the nonvolatile semiconductor memory device in a seventh aspect of the present invention, the oxide film for trench isolation is formed of a CVD insulation film of which material is TEOS.

In a method of manufacturing a nonvolatile semiconductor memory device according to an eighth aspect of the present invention, a tunnel insulation film and a first conductive layer are first successively formed on a semiconductor substrate. The first conductive layer and the tunnel insulation film are patterned in a bit line direction to form an uncompleted floating gate extending in the bit line direction and to form a trench in a surface of the semiconductor substrate in a self-alignment manner with the uncompleted floating gate. An insulation film for trench isolation is filled in the trench. A sidewall spacer is formed on a sidewall of the floating gate. On the semiconductor substrate, an insulation film and a second conductive layer are successively formed to cover the uncompleted floating gate. The second conductive layer, the insulation film and the uncompleted floating gate are patterned in a word line direction to form a completed floating gate and a control gate.

According to the present invention, the sidewall spacer is formed on the sidewall of the floating gate. Accordingly, a trench sidewall is not exposed even if the isolation insulation film in the trench is etched in etching the control gate (memory gate) and the uncompleted floating gate. As a result, a nonvolatile semiconductor memory device with isolation characteristics maintained is obtained.

According to the method of manufacturing a nonvolatile semiconductor memory device in a ninth aspect of the present invention, the sidewall spacer is formed of polysilicon.

In the method of manufacturing a nonvolatile semiconductor memory device in a tenth aspect of the present invention, the step of forming the sidewall spacer includes forming a polysilicon layer on the semiconductor substrate to cover the uncompleted floating gate, and carrying out isotropic etching of the polysilicon layer.

According to the method of manufacturing a nonvolatile semiconductor memory device in an eleventh aspect of the present invention, the insulation film is formed of a thin laminate film of an oxide film, a nitride film and an oxide film.

In the method of manufacturing a nonvolatile semiconductor memory device according to a twelfth aspect of the present invention, the insulation film for trench isolation is formed of a CVD oxide film of which material is TEOS.

In the method of manufacturing a nonvolatile semiconductor memory device according to a thirteenth aspect of the present invention, the first conductive layer is formed of a polysilicon layer or an amorphous silicon layer.

In the method of manufacturing a nonvolatile semiconductor memory device according to a fourteenth aspect of the present invention, the second conductive layer is formed of polysilicon.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 8 is a diagram for describing the operation of the conventional nonvolatile semiconductor memory device.

DESCRIPTION OF THE PREFERRED EMBODIMENTS

An embodiment of the present invention will be described in the following with reference to the figures.

Figure 1:
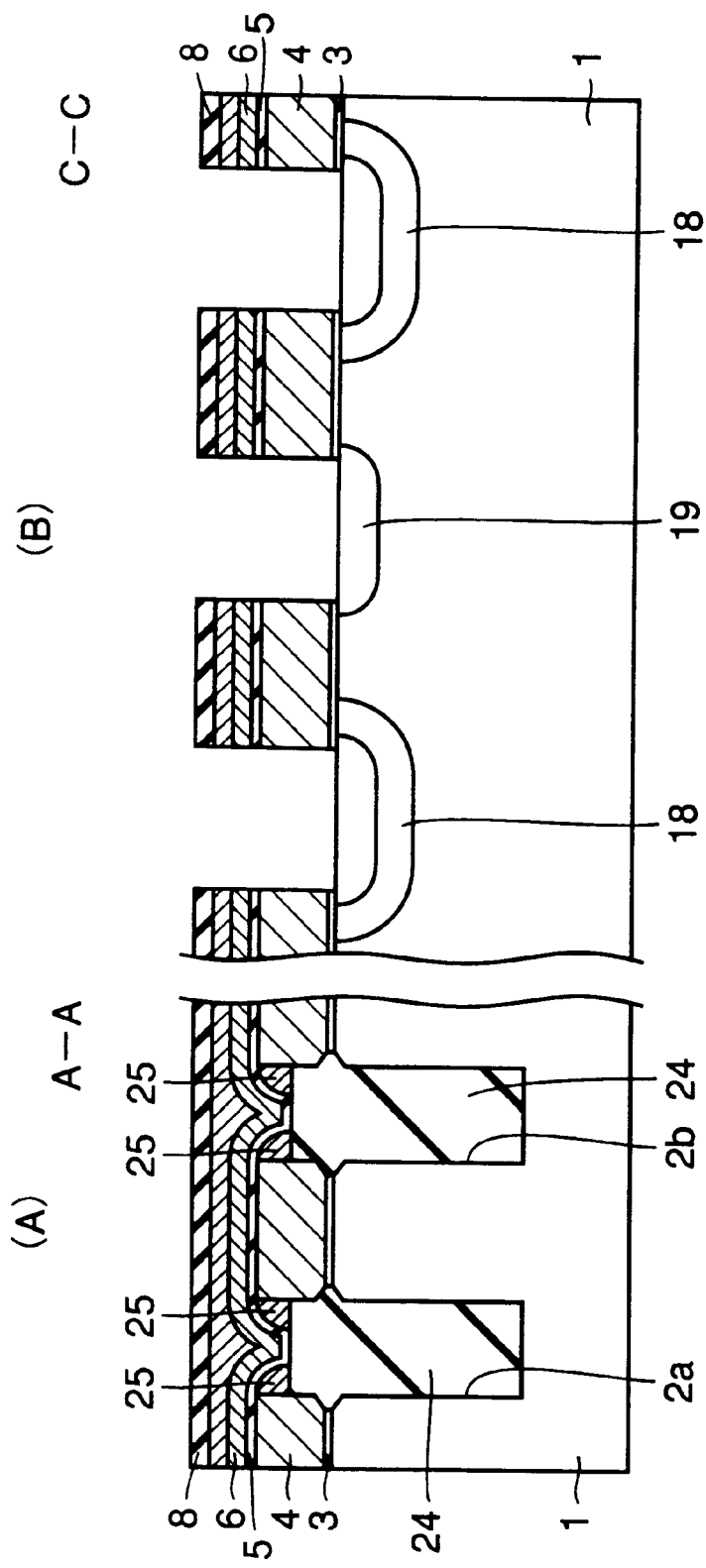
FIG. 1 shows a cross section (A) along the line A—A and a cross section (B) along the line C—C of FIG. 6 described below, of a nonvolatile semiconductor memory device according to an embodiment.

FIG. 1 is a cross section of a main part of a nonvolatile semiconductor memory device according to an embodiment. The plan view of such a nonvolatile semiconductor memory device according to the embodiment is almost the same as the one shown in FIG. 6.

Figure 6:
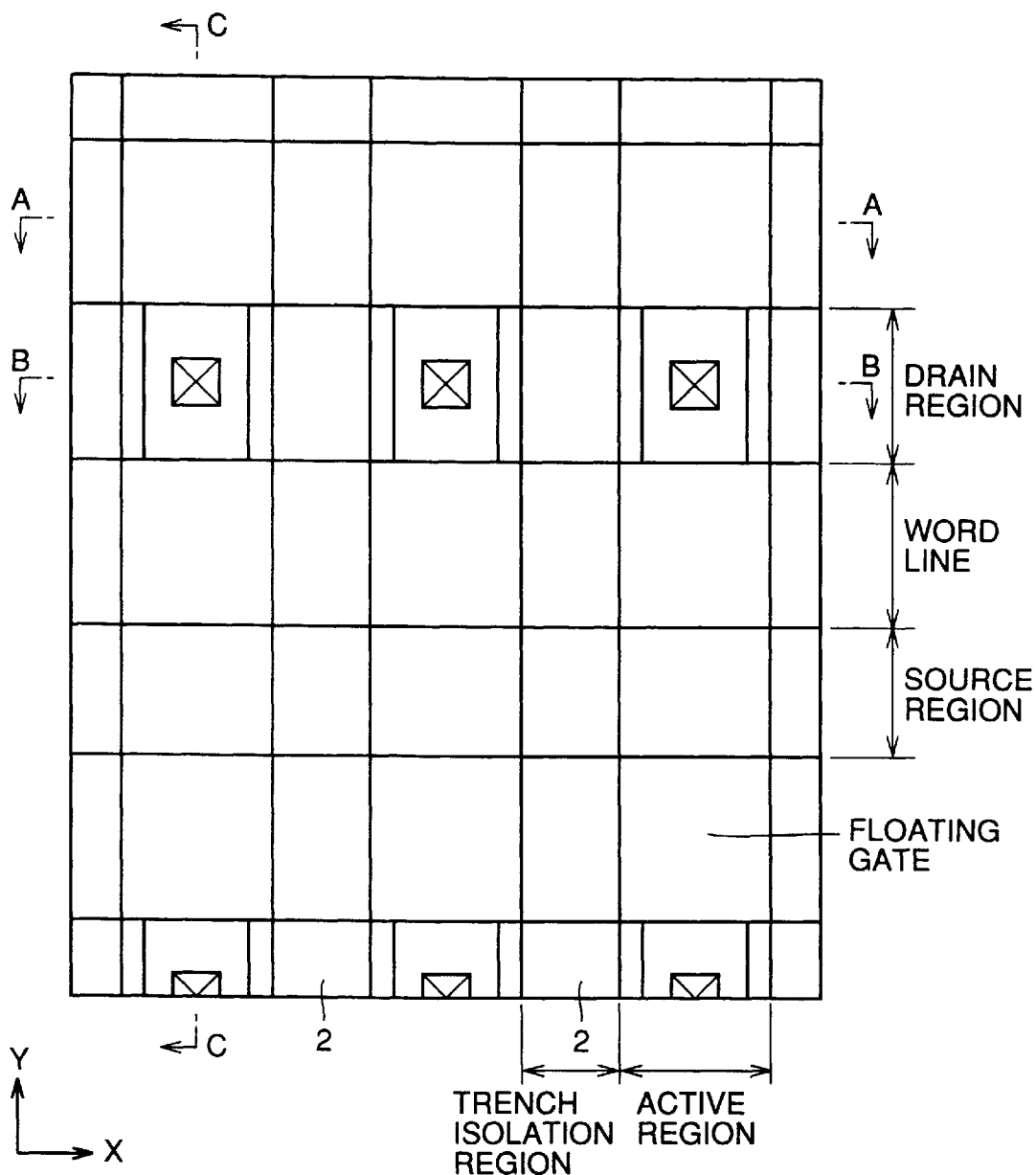
FIG. 6 is a plan view of the nonvolatile semiconductor memory device according to the embodiment or a conventional nonvolatile semiconductor memory device.

In FIG. 1, (A) is a cross section along the line A—A of FIG. 6, and (B) is a cross section along the line C—C of FIG. 6.

Referring to these figures, the nonvolatile semiconductor memory device according to the embodiment includes a semiconductor substrate 1. In a surface of semiconductor substrate 1, first and second trenches 2a and 2b are provided which extend in parallel with each other in the direction of bit lines. An oxide film 24 for trench isolation is filled in first and second trenches 2a and 2b. A floating gate 4 is provided on semiconductor substrate 1 and between first and second trenches 2a and 2b.

A sidewall spacer 25 is provided on a sidewall surface, extending in the bit line direction, of floating gate 4. Sidewall spacer 25 is provided on sidewall surfaces, extending in the bit line direction, on both sides of floating gate 4. Sidewall spacer 25 is formed of polysilicon implanted with an n type impurity. Sidewall spacer 25 increases in thickness from top to bottom. A sidewall surface, extending in the bit line direction, of floating gate 4, is coplanar with a sidewall surface of trenches 2a and 2b. Oxide film 24 for trench isolation is formed of a CVD insulation film of which material is TEOS.

Figure 7:
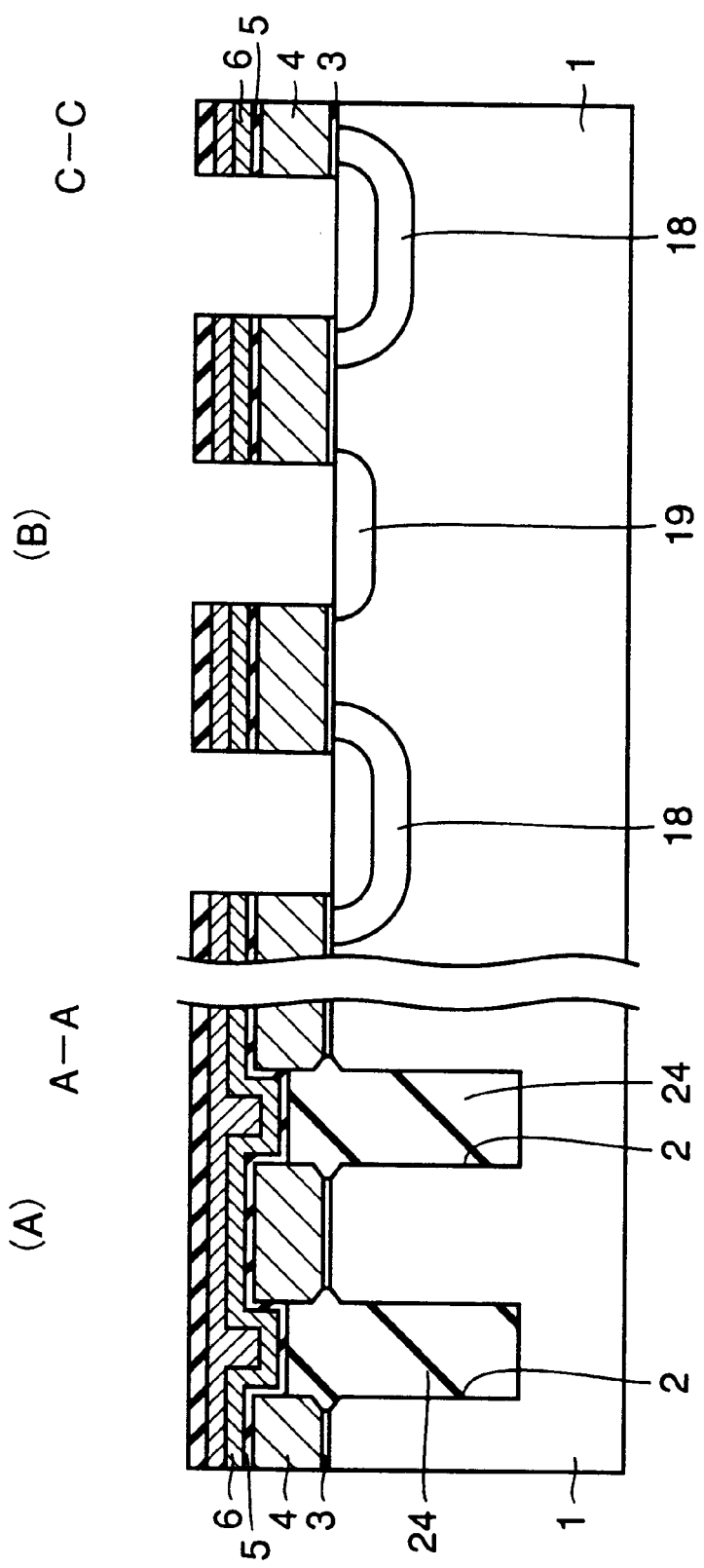
FIG. 7 shows a cross section (A) along the line A—A and a cross section (B) along the line C—C of the conventional nonvolatile semiconductor memory device.

To cover sidewall spacer 25 and floating gate 4, an ONO film 5 serving as an inter poly-insulation film is formed on semiconductor substrate 1. A control gate 6 covers floating gate 4 and sidewall spacer 25 with ONO film 5 therebetween. Since other formation is similar to that of the conventional device shown in FIG. 7, the same or corresponding parts are denoted by the same reference characters and their description will not be repeated.

According to the nonvolatile semiconductor memory device in the embodiment, conductive sidewall spacers 25 are provided on the sidewalls of floating gate 4, and angular portions at an upper surface of the conductor formed by sidewall spacer 25 and floating gate 4 are rounded. Accordingly electric field concentration is not caused on inter poly-insulation film 5 between floating gate 4 and control gate 6. Further, the area in which floating gate 4 and control gate 6 are in contact with each other with inter poly-insulation film 25 therebetween increases, improving the memory cell coupling ratio.

A method of manufacturing the nonvolatile semiconductor memory device according to the embodiment will be described in the following.

Figure 9:
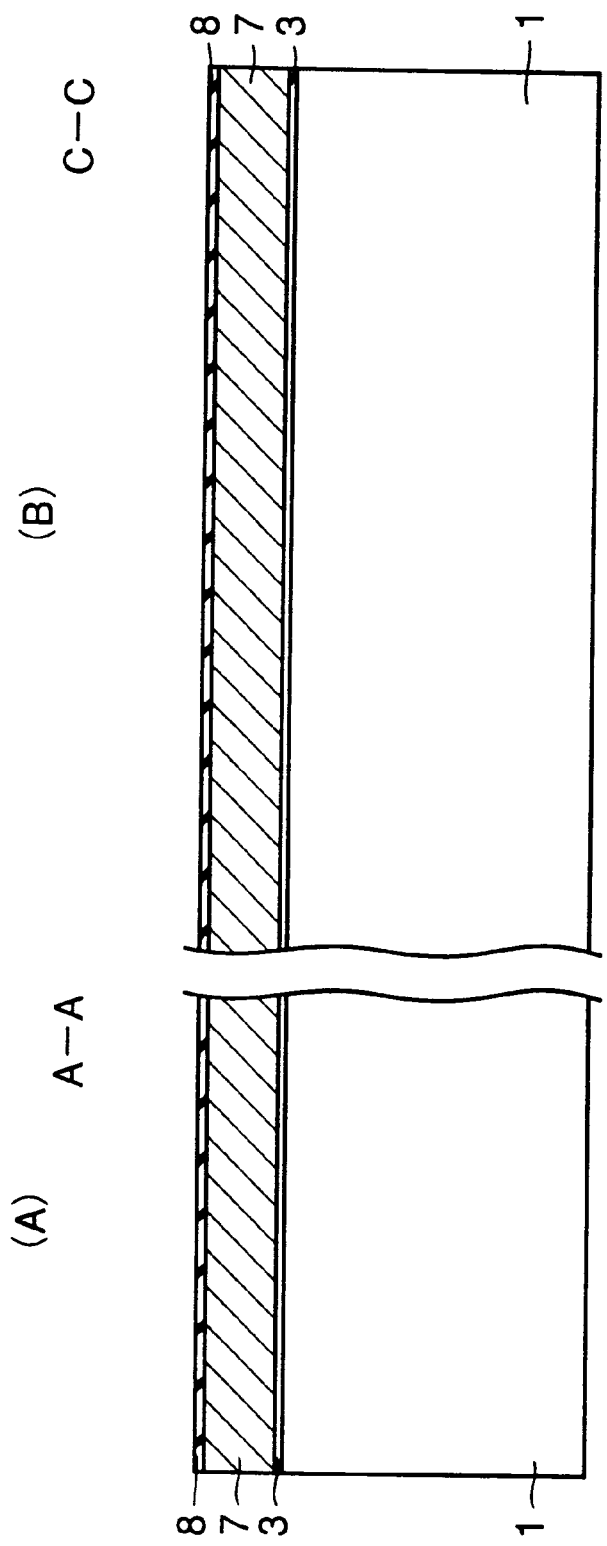
FIGS. 9 to 17 are cross sections of a semiconductor device in the first to ninth steps of a conventional method of manufacturing a nonvolatile semiconductor memory device.
Figure 10:
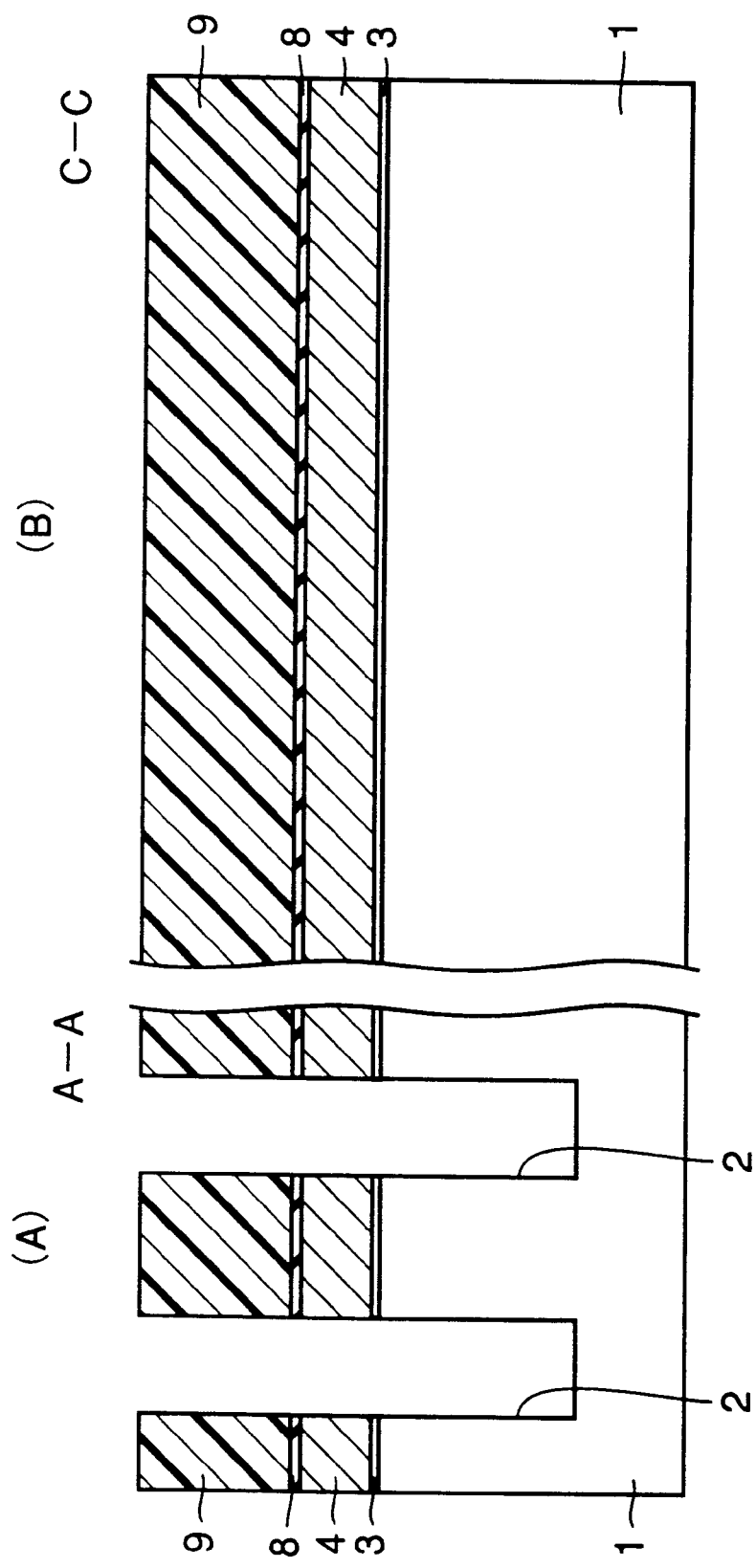

Steps similar to the conventional steps shown in FIGS. 9 and 10 are carried out first. A resist pattern 9 and a CVD oxide film 8 are removed.

Figure 2:
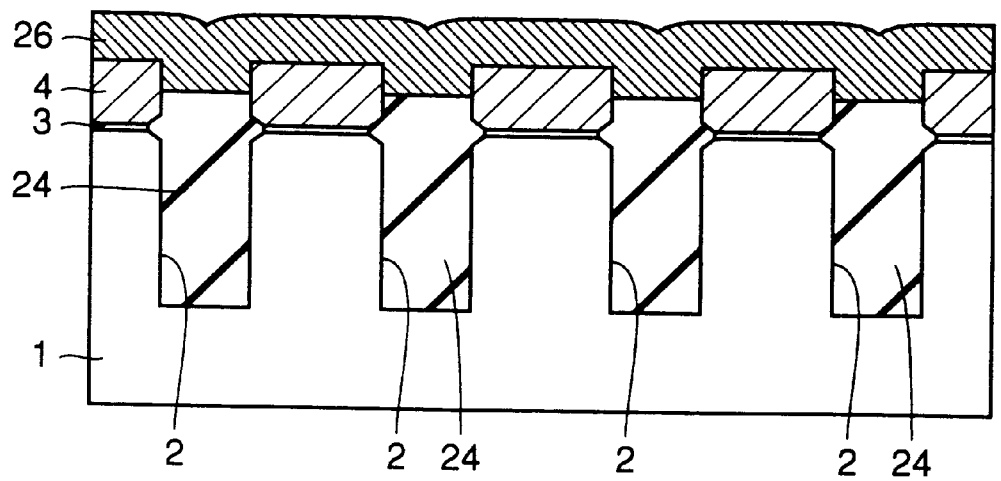
FIGS. 2 and 3 are cross sections of a semiconductor device in the first and second steps of a method of manufacturing a nonvolatile semiconductor memory device according to the embodiment.

Referring to FIG. 2, oxide film 24 for trench isolation is then filled in trench 2. Thereafter, polysilicon 26 doped with an n type impurity such as phosphorus is deposited on semiconductor substrate 1.

Figure 3:
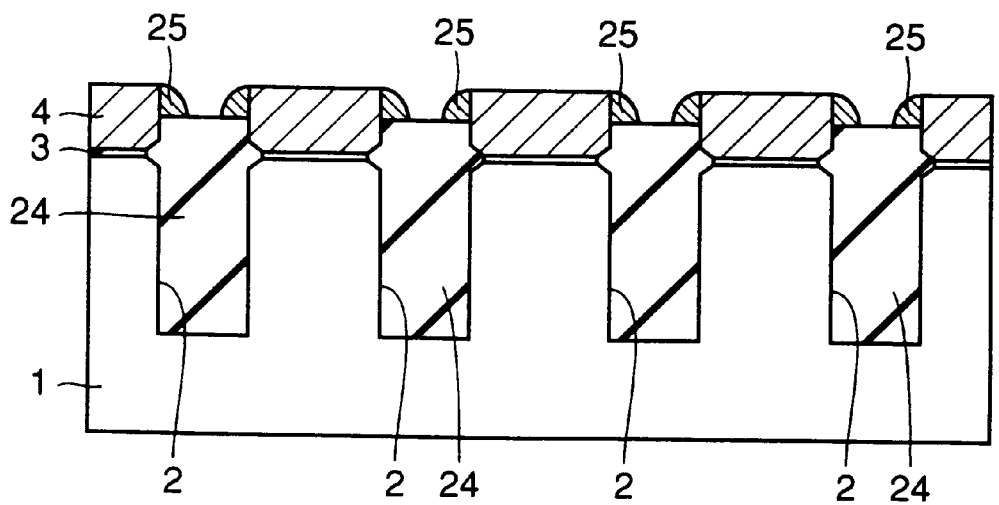
Figure 11:
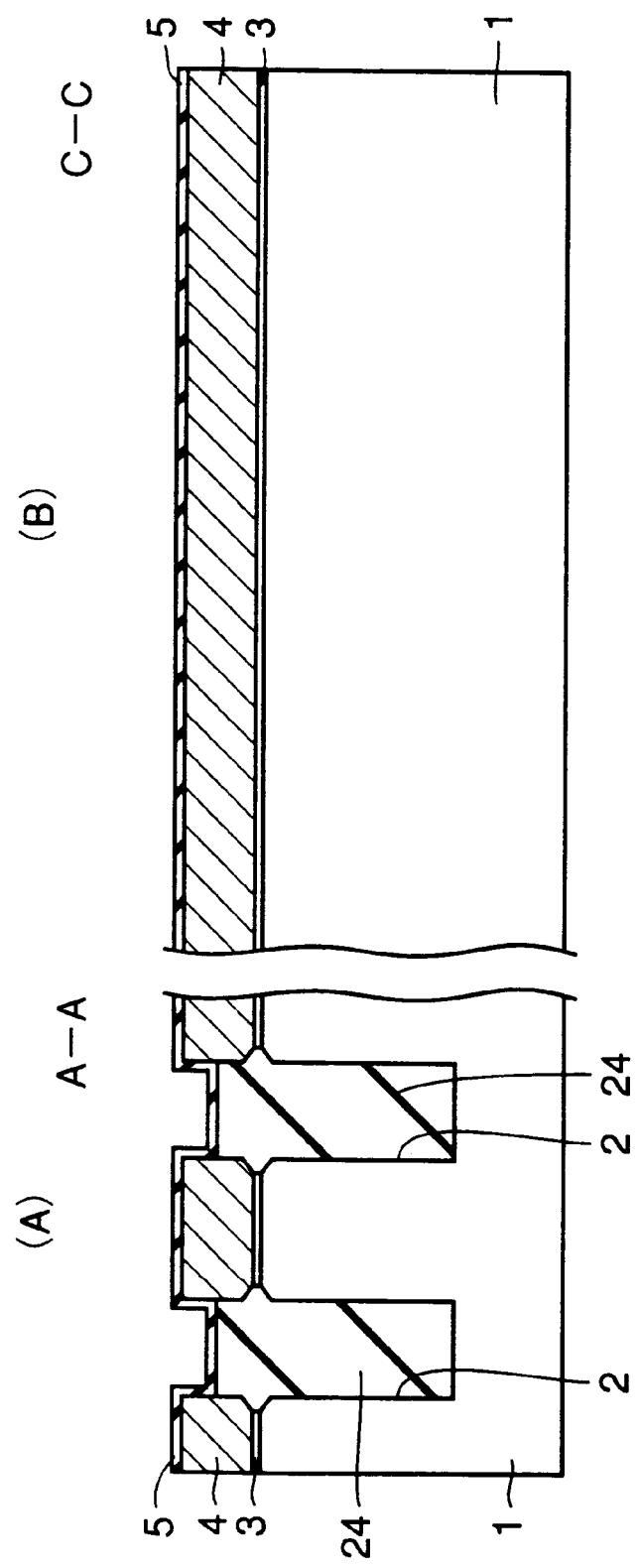
Figure 12:
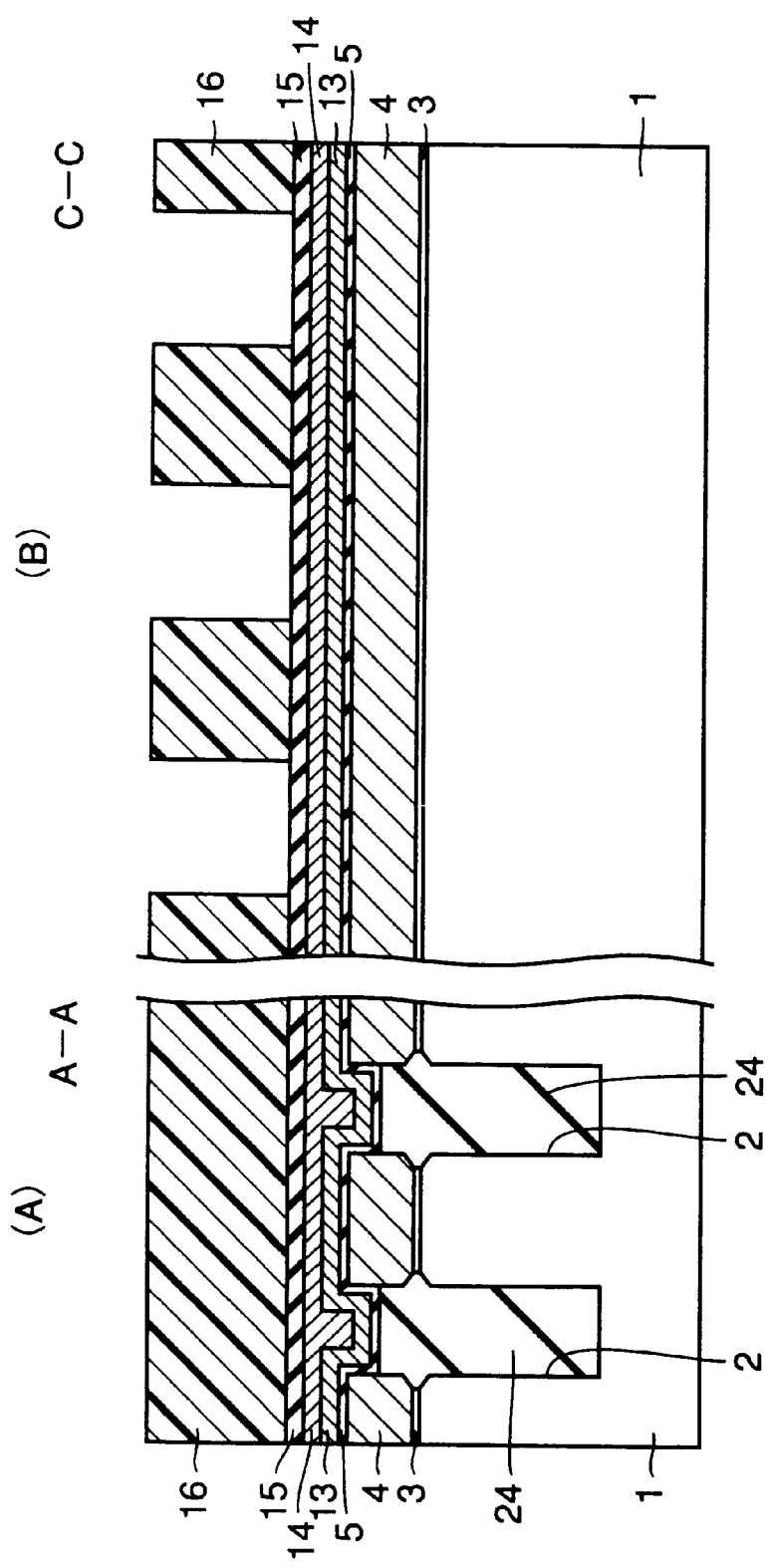
Figure 13:
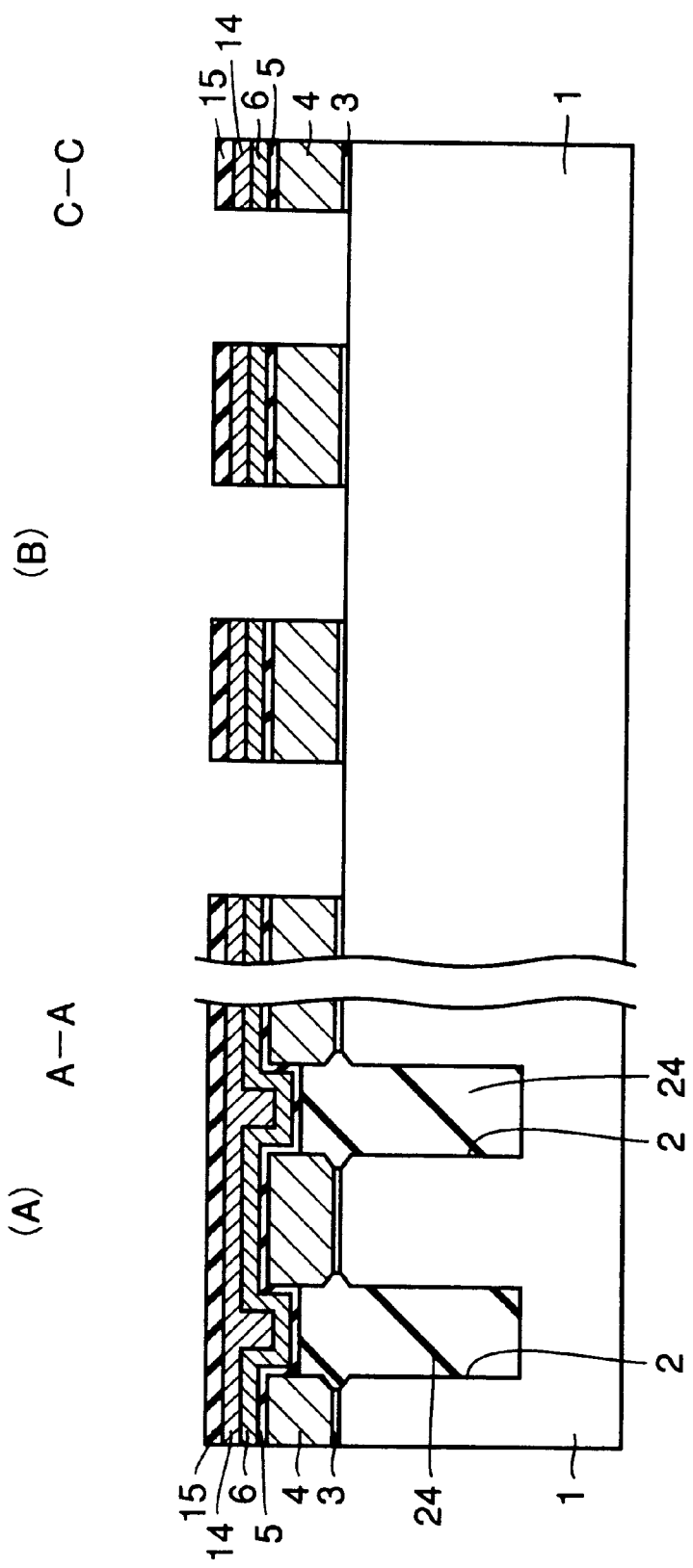
Figure 14:
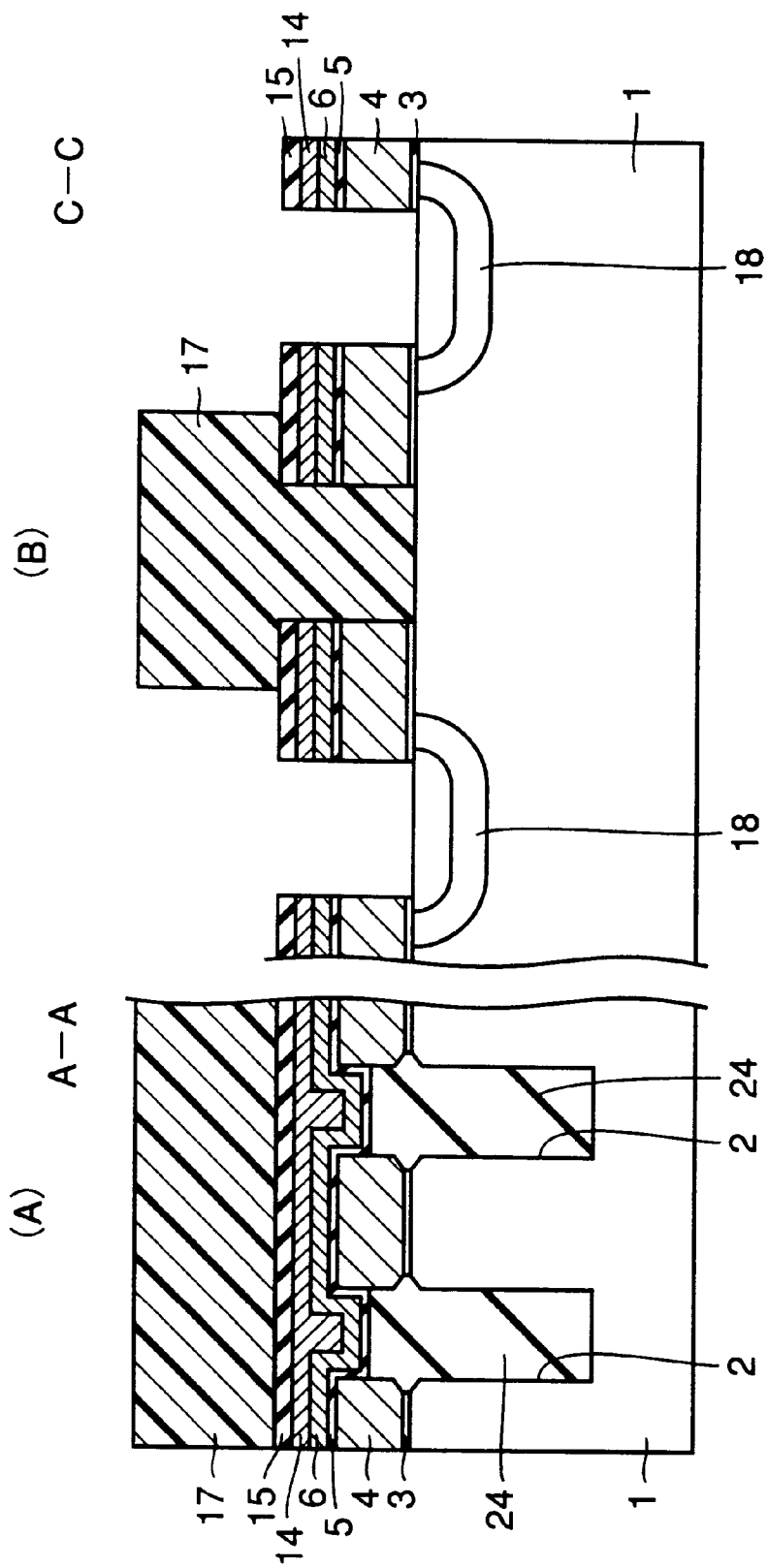
Figure 15:
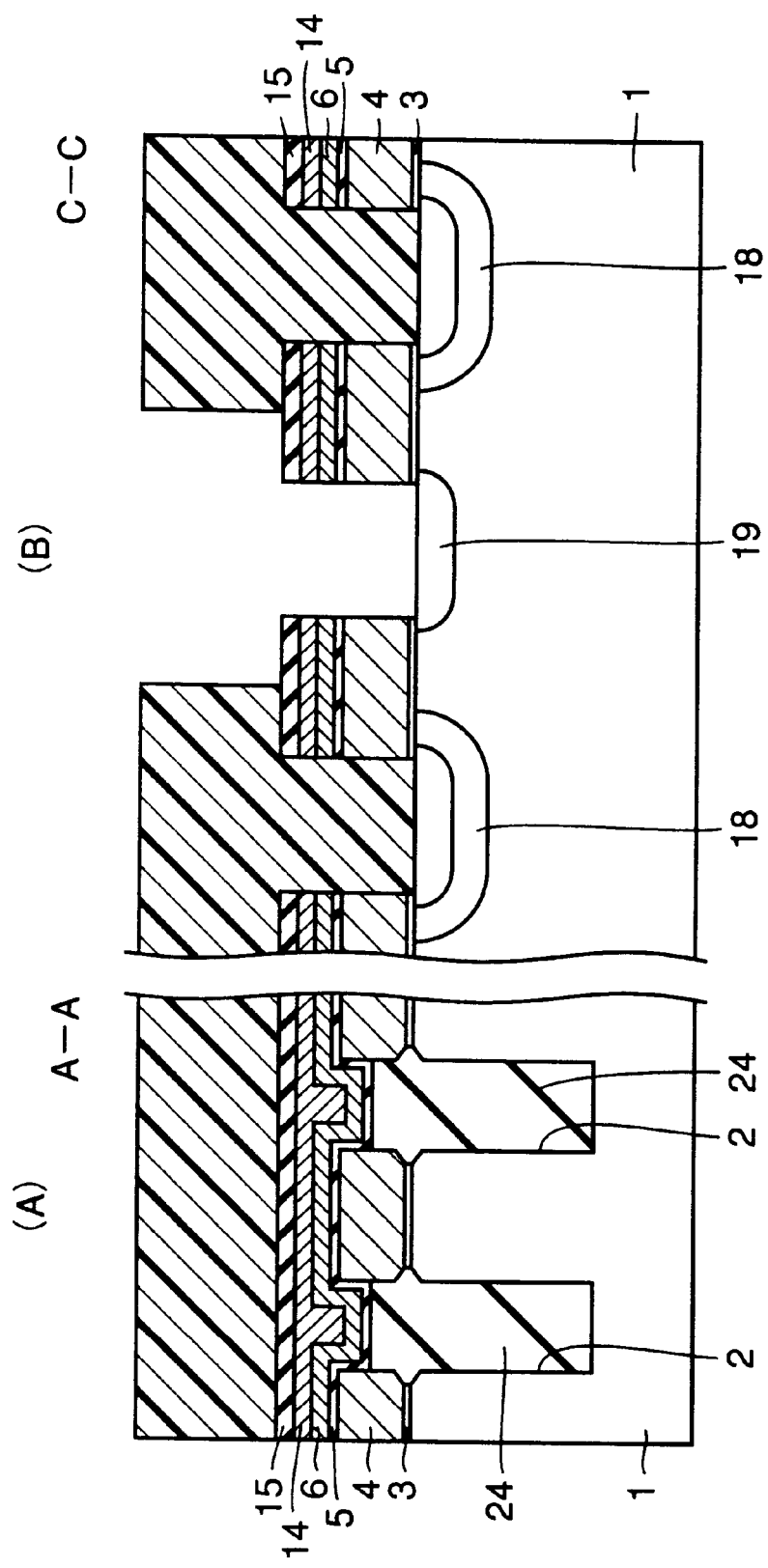
Figure 16:
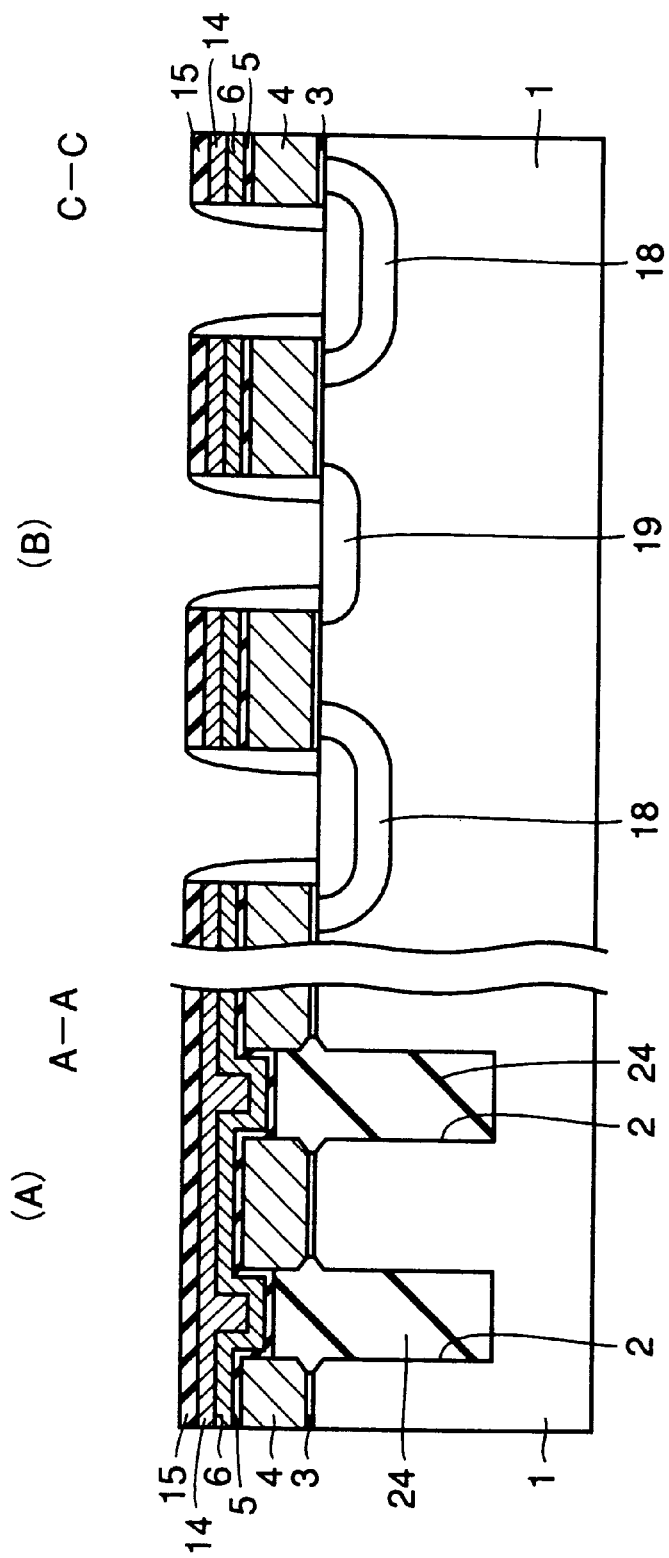
Figure 17:
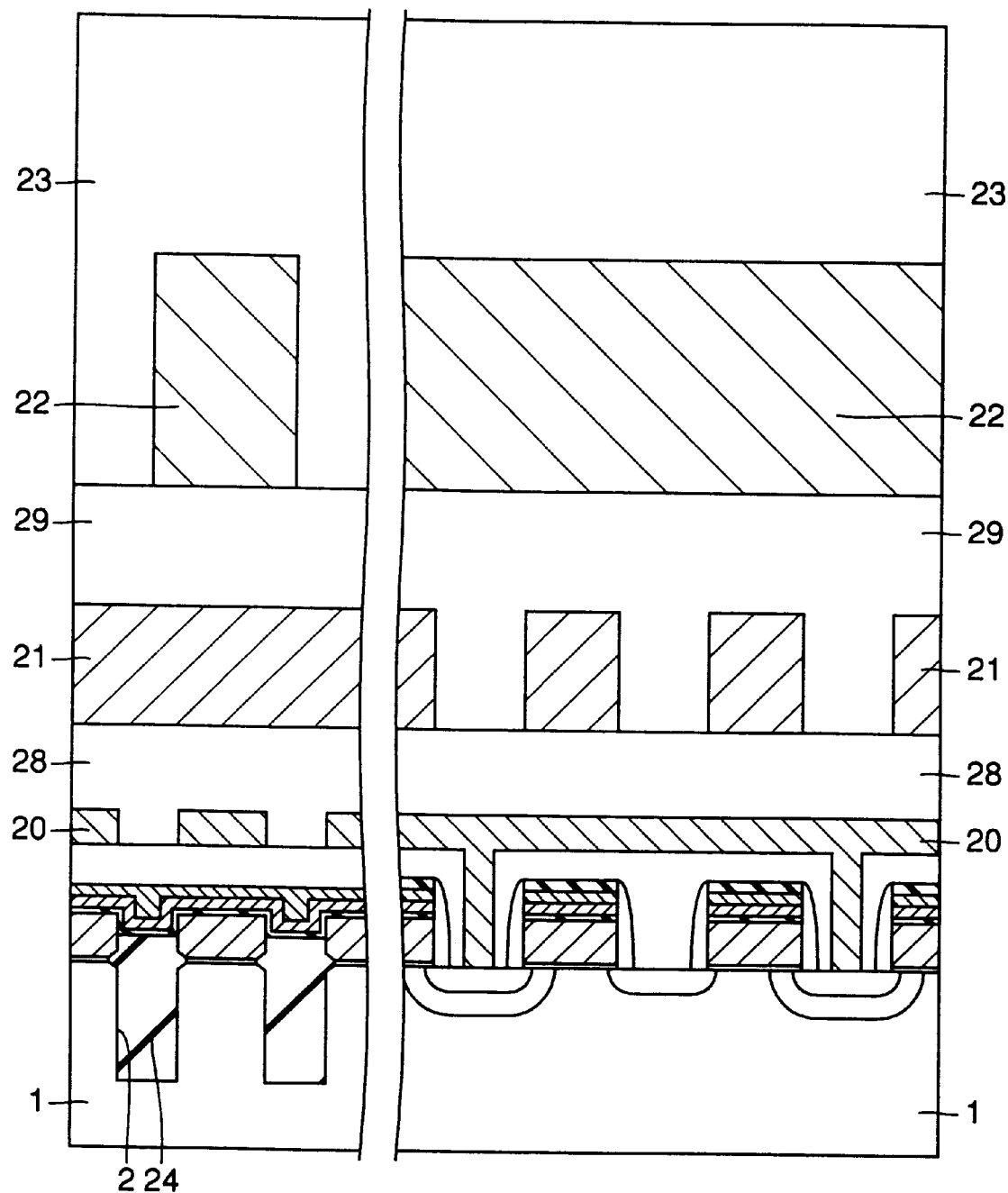
Figure 18:
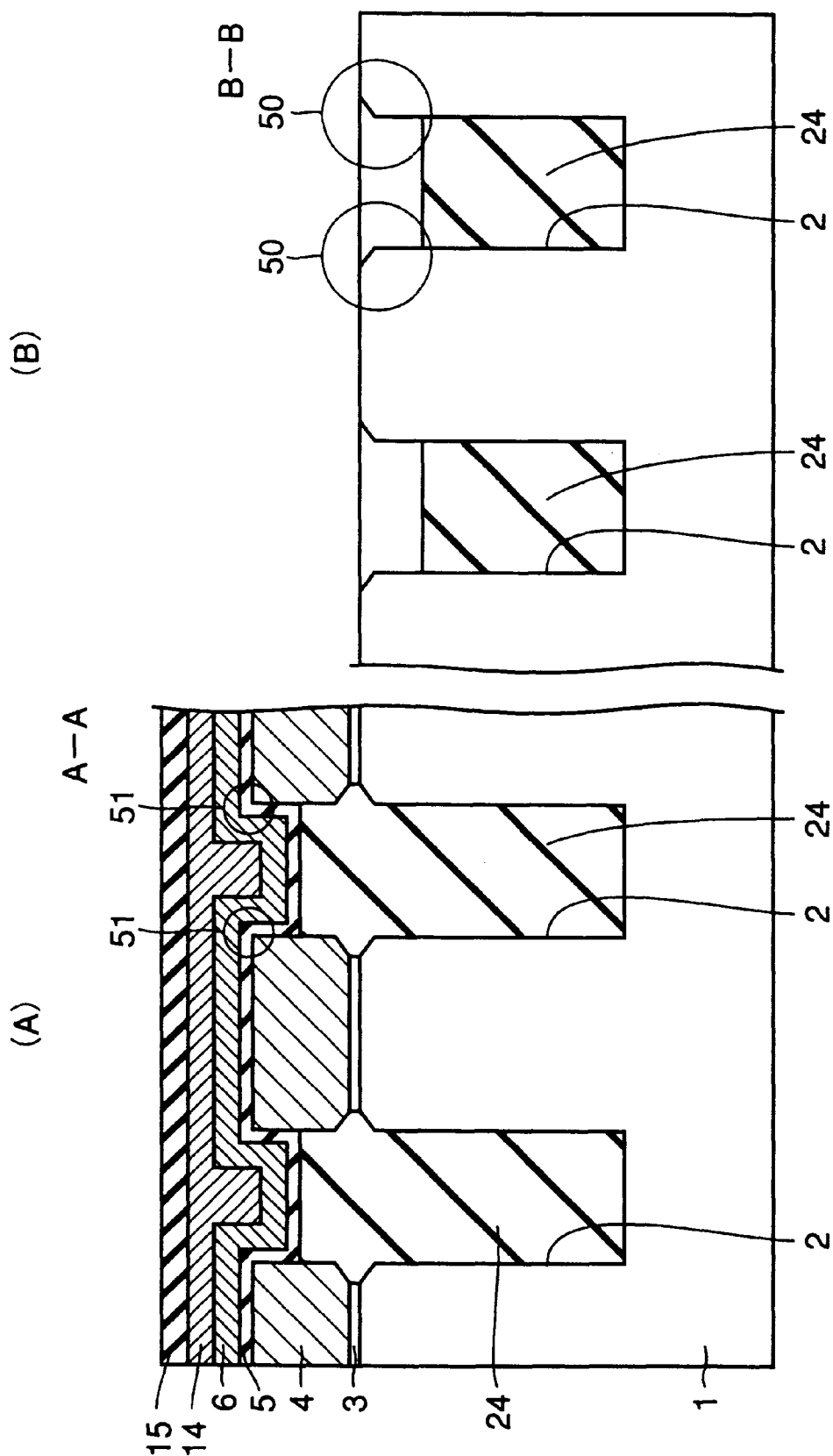
FIG. 18 shows a cross section (A) along the line A—A and a cross section (B) along the line B—B of FIG. 6, showing problems with the conventional method of manufacturing a nonvolatile semiconductor memory device.

Referring to FIGS. 2 and 3, polysilicon 26 is subjected to isotropic etching. Thus, sidewall spacers 25 are formed on the sidewalls of floating gate 4. Then, steps similar to the ONO film formation step shown in FIG. 11 and the conventional steps shown in FIGS. 12 to 17 are carried out to complete a nonvolatile semiconductor memory device. The effects will be described in the following.

Figure 4:
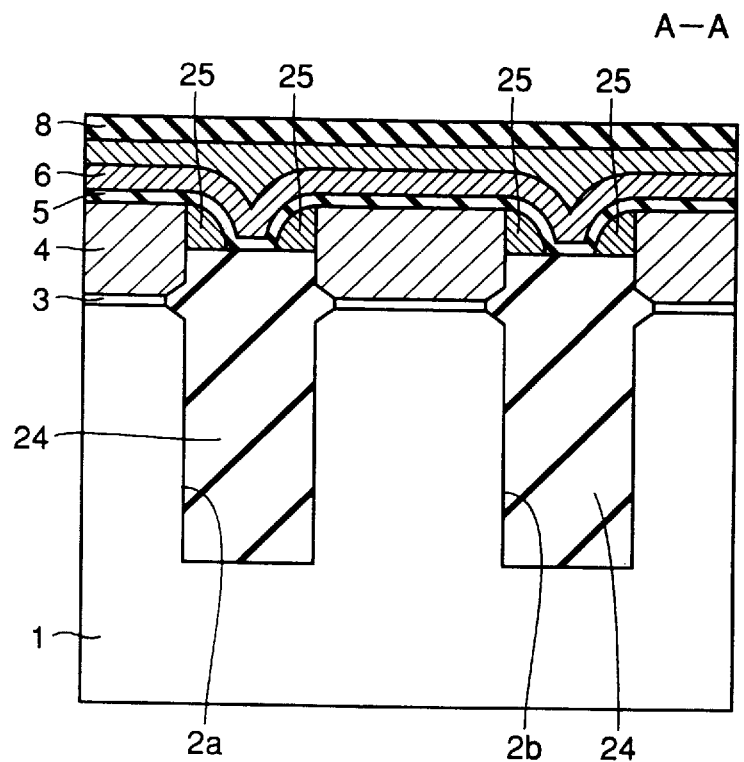
FIG. 4 is a cross section for describing the effects of the nonvolatile semiconductor memory device according to the embodiment.
Figure 5:
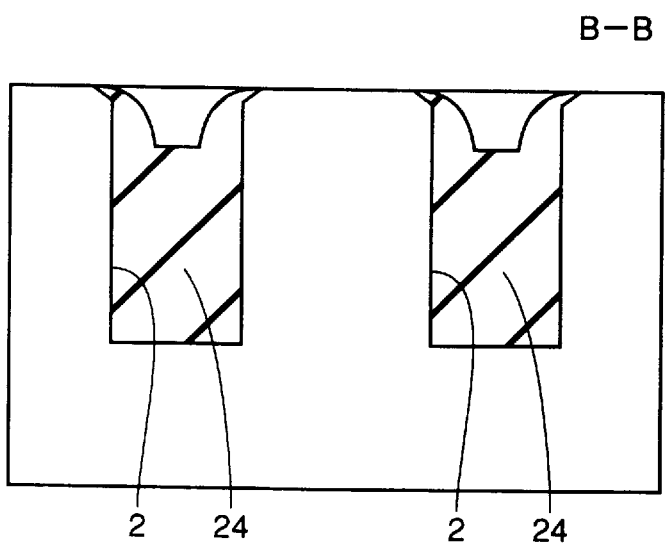
FIG. 5 is a cross section for describing the effects of the method of manufacturing a nonvolatile semiconductor memory device according to the embodiment.

FIG. 4 is a cross section along the line A—A of FIG. 6, showing a main part of the obtained semiconductor device. FIG. 5 is a cross section along the line B—B of FIG. 6, showing a main part of the obtained semiconductor device.

According to the embodiment of the present invention, the sidewall surfaces of trench 2 are not exposed even if insulation film 24 for trench isolation is etched, and therefore isolation characteristics are maintained. Further, the planarity of the conductor formed of floating gate 4 and sidewall spacers 25 is improved during word film formation, with reference to FIG. 4. Accordingly, word lines can be patterned easily.

As described above, according to the nonvolatile semiconductor memory device of the present invention, the area in which a floating gate and a control gate are in contact with each other increases. Accordingly, a nonvolatile semiconductor memory device with an improved memory cell coupling ratio is obtained.

According to the nonvolatile semiconductor memory device of the present invention, the surface shape of the floating gate is smooth, and therefore electric field concentration on an inter poly-insulation film is suppressed.

According to the method of manufacturing a nonvolatile semiconductor memory device of the present invention, a trench inner wall surface is not exposed even if an insulation film for trench isolation is etched. Accordingly, isolation characteristics can be maintained.

According to the method of manufacturing a nonvolatile semiconductor memory device of the present invention, the planarity of a floating gate is improved during word line formation, and therefore word lines can be patterned easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A nonvolatile semiconductor memory device, comprising:

a semiconductor substrate;

first and second trenches provided in a surface of said semiconductor substrate and extending in parallel with each other in a bit line direction;

an oxide film for trench isolation filled in said first and second trenches;

a floating gate provided between said first and second trenches on said semiconductor substrate; and a sidewall spacer provided on a sidewall surface, extending in the bit line direction, of said floating gate, said sidewall spacer being formed of a conductive layer including silicon, wherein said conductive layer including silicon includes an n type impurity.

2. A nonvolatile semiconductor memory device, comprising:

a semiconductor substrate;

first and second trenches provided in a surface of said semiconductor substrate and extending in parallel with each other in a bit line direction;

an oxide film for trench isolation filled in said first and second trenches;

a floating gate provided between said first and second trenches on said semiconductor substrate; and a sidewall spacer provided on a sidewall surface, extending in the bit line direction, of said floating gate and on said oxide film for trench isolation, said sidewall spacer being formed of a conductive layer including silicon, wherein said conductive layer including silicon includes an n type impurity.

3. The nonvolatile semiconductor memory device according to claim 2, wherein said sidewall spacer is provided on sidewall surfaces, extending in the bit line direction, on both sides of said floating gate.

4. The nonvolatile semiconductor memory device according to claim 1, wherein said sidewall spacer increases in thickness from top to bottom.

5. The nonvolatile semiconductor memory device according to claim 1, wherein said sidewall surface, extending in the bit line direction, of said floating gate is coplanar with a sidewall surface of said trench.

6. The nonvolatile semiconductor memory device according to claim 1, wherein said insulation film for trench isolation is formed of a CVD insulation film of which material is TEOS.

* * * * *